(12) United States Patent
Im et al.

(10) Patent No.: US 11,101,327 B2
(45) Date of Patent: Aug. 24, 2021

(54) IMAGE SENSOR

(71) Applicant: SAMSUNG ELECTRONICS CO., LTD., Suwon-si (KR)

(72) Inventors: Dong-Mo Im, Seoul (KR); Gwi-Deok Lee, Suwon-si (KR); Tae-Yon Lee, Seoul (KR); Masaru Ishii, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/829,265

(22) Filed: Mar. 25, 2020

(65) Prior Publication Data

US 2020/0227482 A1 Jul. 16, 2020

Related U.S. Application Data

(63) Continuation of application No. 16/106,576, filed on Aug. 21, 2018, now Pat. No. 10,615,228.

(30) Foreign Application Priority Data

Oct. 31, 2017 (KR) .......................... 10-2017-0143642

(51) Int. Cl.
*H01L 27/30* (2006.01)
*H01L 27/146* (2006.01)
*H04N 5/374* (2011.01)

(52) U.S. Cl.
CPC ........ *H01L 27/307* (2013.01); *H01L 27/1463* (2013.01); *H01L 27/14603* (2013.01);
(Continued)

(58) Field of Classification Search
None
See application file for complete search history.

(56) References Cited

U.S. PATENT DOCUMENTS 9,293,489 B2 * 3/2016 Lee ..................... H01L 27/1464
9,373,656 B2   6/2016 Park
(Continued)

OTHER PUBLICATIONS

Nishimura et al., "An over 120dB simultaneous-capture wide-dynamic-range 1.6e-ultra-low-reset-noise organic-photoconductive-film CMOS image sensor", IEEE International, 2016.

*Primary Examiner* — Michelle Mandala
*Assistant Examiner* — Jordan M Klein
(74) *Attorney, Agent, or Firm* — Lee IP Law, PC

(57) ABSTRACT

An image sensor includes a color filter on a substrate, first and second organic photodiodes on the color filter, and first and second capacitors connected to the first and second organic photodiodes, respectively. The color filter is spaced apart from a first surface of the substrate. Each of the first and second organic photodiodes face an upper surface of the color filter. The first capacitor includes a first conductive pattern and a first insulating space. The first conductive pattern extends through the substrate, and the first insulating spacer surrounds a sidewall of the first conductive pattern and has a first thickness. The second capacitor includes a second conductive pattern and a second insulating spacer. The second conductive pattern extends through the substrate, and the second insulating spacer surrounds a sidewall of the second conductive pattern and has a second thickness smaller than the first thickness.

20 Claims, 18 Drawing Sheets

(52) U.S. Cl.
CPC .. *H01L 27/14612* (2013.01); *H01L 27/14621* (2013.01); *H01L 27/14634* (2013.01); *H01L 27/14645* (2013.01); *H01L 27/14665* (2013.01); *H04N 5/374* (2013.01)

(56) References Cited

U.S. PATENT DOCUMENTS

| | | | |
|---|---|---|---|
| 9,379,159 B2 | 6/2016 | Qian et al. | |
| 9,426,399 B2 | 8/2016 | Yamaguchi | |
| 9,431,448 B2 | 8/2016 | Okamoto | |
| 9,478,760 B2 | 10/2016 | Tamaki et al. | |
| 10,615,228 B2 * | 4/2020 | Im | H01L 27/14612 |
| 2015/0194469 A1 * | 7/2015 | Joei | H01L 27/14647 257/40 |
| 2015/0287766 A1 * | 10/2015 | Kim | H01L 27/14641 250/208.1 |
| 2015/0372036 A1 * | 12/2015 | Suh | H01L 27/14609 348/273 |
| 2016/0133865 A1 * | 5/2016 | Yamaguchi | H01L 51/4213 257/40 |
| 2016/0240580 A1 | 8/2016 | Xianyu et al. | |
| 2017/0170238 A1 * | 6/2017 | Lee | H01L 27/14621 |
| 2018/0081099 A1 * | 3/2018 | Toda | H01L 27/14647 |
| 2018/0090533 A1 * | 3/2018 | Otake | H01L 27/14627 |
| 2018/0190696 A1 * | 7/2018 | Lee | H01L 27/14623 |
| 2018/0190707 A1 * | 7/2018 | Lee | H01L 27/14645 |
| 2018/0219046 A1 * | 8/2018 | Yamaguchi | H01L 27/14647 |
| 2018/0286922 A1 * | 10/2018 | Togashi | H01L 21/76898 |
| 2019/0326345 A1 * | 10/2019 | Yamamoto | H01L 27/14638 |

\* cited by examiner

IMAGE SENSOR

CROSS-REFERENCE TO RELATED APPLICATIONS

This is a continuation application based on pending application Ser. No. 16/106,576, filed Aug. 21, 2018, the entire contents of which is hereby incorporated by reference. Korean Patent Application No. 10-2017-0143642, filed on Oct. 31, 2017, in the Korean Intellectual Property Office, and entitled: "Image Sensor," is incorporated by reference herein in its entirety.

BACKGROUND

1. Field

Example embodiments relate to an image sensor.

2. Description of the Related Art

An image sensor may be used as part of a system to convert light into data for, e.g., capturing a still or moving image.

SUMMARY

Embodiments are directed to an image sensor including a color filter on a substrate, a first organic photodiode on the color filter, a second organic photodiode on the color filter, a first capacitor connected to the first organic photodiode, and a second capacitor connected to the second organic photodiode. The color filter may be spaced apart from a first surface of the substrate. The first organic photodiode may face an upper surface of the color filter. The second organic photodiode may face an upper surface of the color filter. The first capacitor may include a first conductive pattern and a first insulating space. The first conductive pattern may extend through the substrate, and the first insulating spacer may surround a sidewall of the first conductive pattern and have a first thickness. The second capacitor may include a second conductive pattern and a second insulating spacer. The second conductive pattern may extend through the substrate, and the second insulating spacer may surround a sidewall of the second conductive pattern and have a second thickness smaller than the first thickness.

Embodiments are also directed to an image sensor including a color filter on a substrate, an organic photodiode on the color filter, a first capacitor including a first conductive pattern and a first insulating spacer, and a second capacitor including a second conductive pattern and a second insulating spacer. The color filter may be spaced apart from a first surface of the substrate. The organic photodiode may face an upper surface of the color filter. The first conductive pattern may be connected to the organic photodiode and extend through the substrate, and the first insulating spacer may surround a sidewall of the first conductive pattern and have a first thickness. The second conductive pattern may not be directly connected to the organic photodiode and extend through the substrate, and the second insulating spacer may surround a sidewall of the second conductive pattern and have a second thickness smaller than the first thickness.

Embodiments are also directed to an image sensor including a color filter on a semiconductor substrate, first and second lower transparent electrodes spaced apart from each other on the same plane, an organic photodiode layer on the first and second lower transparent electrodes, an upper transparent electrode layer on the organic photodiode layer, a first TSV extending through the semiconductor substrate, and a deep trench isolation pattern extending through the semiconductor substrate. The color filter may be spaced apart from a first surface of the semiconductor substrate. The first and second lower transparent electrodes may face an upper surface of the color filter. The first TSV may be connected to the first lower transparent electrode. The deep trench isolation pattern may be connected to the second lower transparent electrode.

BRIEF DESCRIPTION OF THE DRAWINGS

Features will become apparent to those of skill in the art by describing in detail example embodiments with reference to the attached drawings in which.

DETAILED DESCRIPTION

Figure 1:
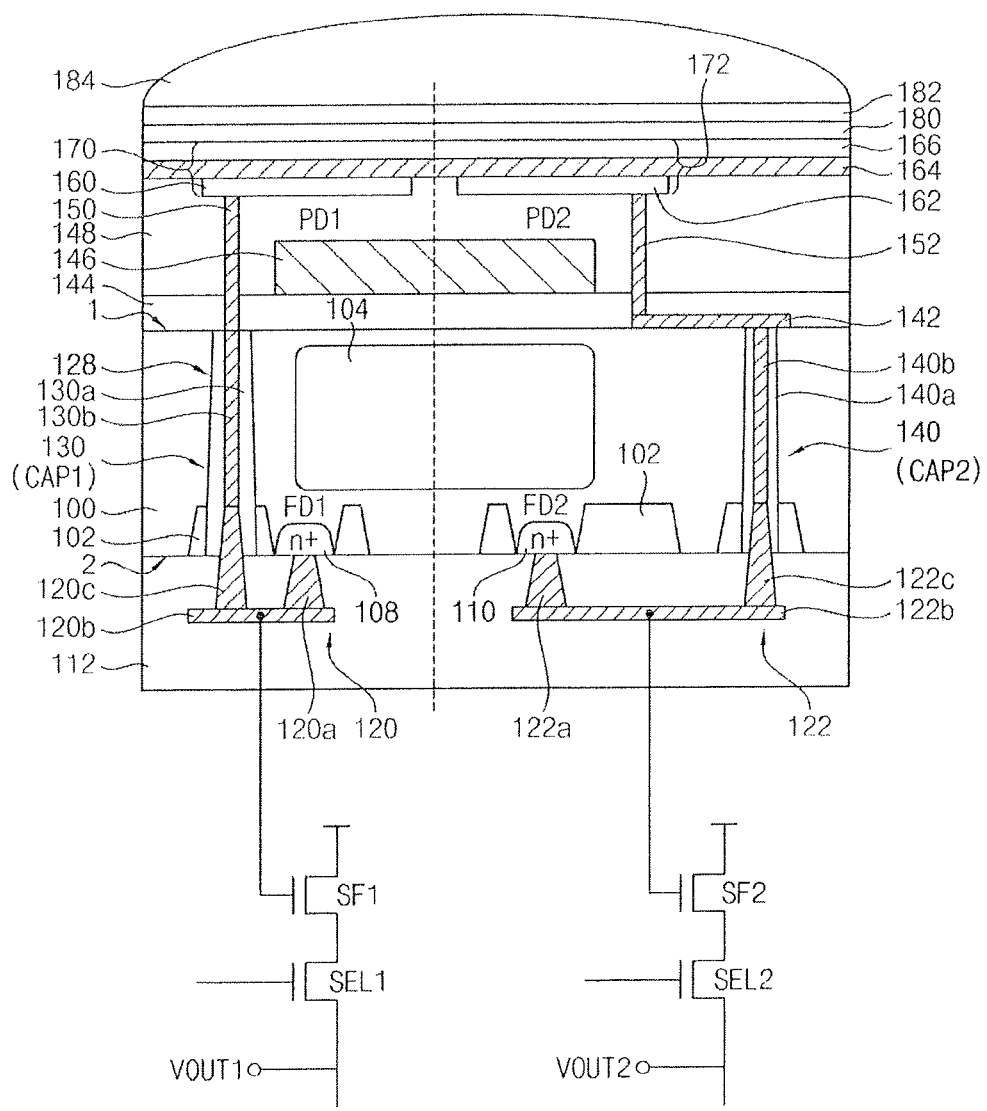
FIG. 1 illustrates a unit pixel of an image sensor in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
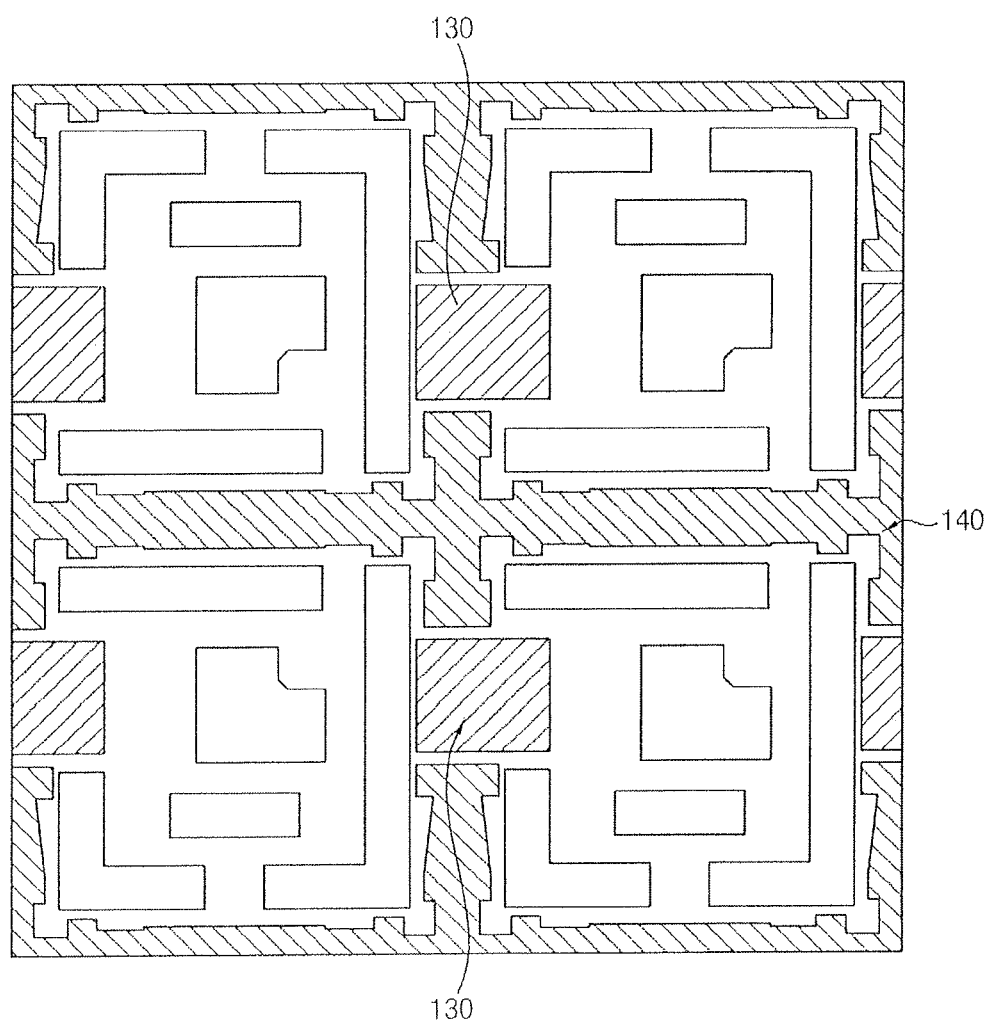
FIG. 2 illustrates a layout of the unit pixels of the image sensor in accordance with an example embodiment.
Figure 3:
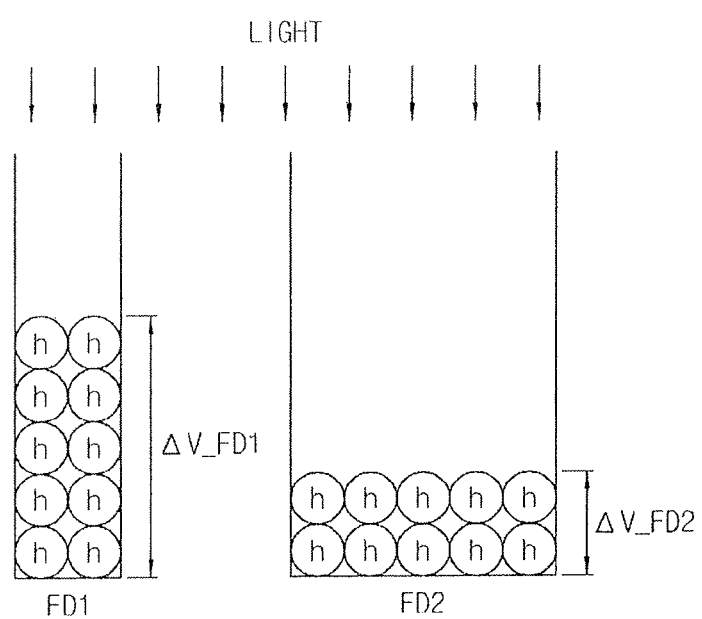
FIG. 3 illustrates voltages of first and second floating diffusion regions of the unit pixel of the image sensor of FIG. 1.

FIG. 1 shows a unit pixel of an image sensor in accordance with an example embodiment, and FIG. 2 shows a layout of the unit pixels of the image sensor in accordance with an example embodiment. FIG. 3 shows voltages of first and second floating diffusion regions of the unit pixel of the image sensor of FIG. 1.

Referring to FIGS. 1 and 2, the image sensor may include a plurality of unit pixels arranged in a matrix pattern. Each unit pixel may include a first photodiode region PD1 and a second photodiode region PD2, which may respectively include a first organic photodiode 170 and a second organic photodiode 172. The first organic photodiode 170 may serve as a high sensitivity photodiode, and the second organic photodiode 172 may serve as a low sensitivity photodiode.

A first capacitor CAP1 electrically connected to the first organic photodiode 170 may have a first capacitance, and a second capacitor CAP2 electrically connected to the second organic photodiode 172 may have a second capacitance greater than the first capacitance. A first through silicon via (TSV) 130 electrically connected to the first organic photodiode 170 may serve as the first capacitor CAP1. A deep trench isolation pattern 140 electrically connected to the second organic photodiode 172 may serve as the second capacitor CAP2. The unit pixel may include transistors electrically connected to the first and second organic photodiodes 170 and 172. The transistors may be formed on a semiconductor substrate 100.

The semiconductor substrate 100 may include, e.g., a bulk substrate, an epitaxial substrate, or a silicon-on-insulator (SOI) substrate. The semiconductor substrate 100 may include a semiconductor material, e.g., silicon or germanium, or a compound semiconductor, e.g., silicon carbide, gallium arsenide, indium arsenide, etc. The semiconductor substrate 100 may be, e.g., a p-type semiconductor substrate.

The semiconductor substrate 100 may include a unit pixel region in which unit pixels are formed. The unit pixel region may be defined by, e.g., the deep trench isolation pattern 140 extending through the semiconductor substrate 100.

The semiconductor substrate 100 may have a first surface 1 and a second surface 2 opposite the first surface 1. Transistors, photoelectric conversion elements, wiring structures may be formed on the second surface 2 of the semiconductor substrate 100. An isolation layer 102 may be formed on the second surface 2 of the semiconductor substrate 100. Light may be incident on the first surface 1 of the semiconductor substrate 100. The first and second organic photodiodes 170 and 172 may be formed on the first surface 1 of the semiconductor substrate 100.

A first insulating interlayer 144 may be formed on the first surface 1 of the semiconductor substrate 100. The first insulating interlayer 144 may have a flat upper surface.

A color filter 146 may be formed on the first insulating interlayer 144. The color filter 146 may be, e.g., a red color filter or a blue color filter.

A second insulating interlayer 148 may cover the color filter 146. The first and second organic photodiodes 170 and 172 may be formed on the second insulating interlayer 148.

The first organic photodiode 170 may have a stacked structure including a first lower transparent electrode 160, an organic layer 164, and an upper transparent electrode layer 166 sequentially stacked. The second organic photodiode 172 may have a stacked structure including a second lower transparent electrode 162, the organic layer 164, and the upper transparent electrode layer 166 sequentially stacked.

The first and second lower transparent electrodes 160 and 162 may be spaced apart from each other on substantially the same plane. The organic layer 164 and the upper transparent electrode 166 may be commonly used for the first and second organic photodiodes 170 and 172. Thus, the organic layer 164 and the upper transparent electrode layer 166 may cover both of the first and second organic photodiodes 170 and 172. The first and second organic photodiodes 170 and 172 may be differentiated from each other by the first and second lower transparent electrodes 160 and 162.

In the present example embodiment, upper surfaces of the first and second lower transparent electrodes 160 and 162 may have substantially the same area. Photocharges generated from the first and second organic photodiodes 170 and 172, respectively, under substantially the same intensity of illumination may be substantially the same for each other.

The first and second lower transparent electrodes 160 and 162 may be spaced apart from and facing the color filter 146. For example, at least a portion of each of the first and second lower transparent electrodes 160 and 162 may overlap the color filter 146 in a vertical direction.

In the present example embodiment, the first and second lower transparent electrodes 160 and 162 may be disposed in recesses in the second insulating interlayer 148. Upper surfaces of the first and second lower transparent electrodes 160 and 162 and the second insulating interlayer 148 may be flat.

The organic layer 164 may be formed on the first and second lower transparent electrodes 160 and 162 and the second insulating interlayer 148. The organic layer 164 may include an organic material that may cause only a light having a specific wavelength or range of wavelengths to be photoelectrically converted. For example, the organic layer 164 may be photoelectrically converted only by a green light.

The organic layer 164 may include, e.g., a complex organic material having an electron donating organic material and an electron receiving organic material. For example, the organic layer 164 may include a single layer or a plurality of layers in which p-type semiconductor and an n-type semiconductor form a PN junction or a bulk heterojunction.

In the present example embodiment, the first and second lower transparent electrodes 160 and 162 may include, e.g., ITO, IZO, ZnO, $SnO_2$, antimony-doped tin oxide (ATO), Al-doped zinc oxide (AZO), gallium-doped zinc oxide (GZO), $TiO_2$, or fluorine-doped tin oxide (FTO).

In the present example embodiment, the upper transparent electrode layer 166 may include, e.g., ITO, IZO, ZnO, $SnO_2$, antimony-doped tin oxide (ATO), Al-doped zinc oxide (AZO), gallium-doped zinc oxide (GZO), $TiO_2$, or fluorine-doped tin oxide (FTO).

The upper transparent electrode 166 may be formed on a protective layer 180. In the present example embodiment, the protective layer 180 may include, e.g., an oxide. A planarization layer 182 may be further formed on the protective layer 180.

A microlens 184 may be formed on the planarization layer 182.

In the present example embodiment, a lower photoelectric conversion element 104 may be formed in the semiconductor substrate 100. The lower photoelectric conversion element 104 may overlap the color filter 146 in the vertical direction. The lower photoelectric conversion element 104 may be a photodiode. The lower photoelectric conversion element 104 may include an impurity region.

A first floating diffusion (FD) region 108 and a second FD region 110 may be disposed in the semiconductor substrate 100. The first and second FD regions 108 and 110 may be spaced apart from the lower photoelectric conversion element 104, and may be exposed by the second surface 2 of the semiconductor substrate 100. The first and second FD regions 108 and 110 may be doped with, e.g., n-type impurities.

The transistors for the unit pixel may be formed around the second surface 2 of the semiconductor substrate 100. For example, a drive transistor, a selection transistor, a reset transistor, etc., may be formed around the second surface 2 of the semiconductor substrate 100.

A third insulating interlayer 112 and first and second wiring structures 120 and 122 may be formed on the second surface 2 of the semiconductor substrate 100. The first and second wiring structures 120 and 122 may be formed in the third insulating interlayer 112.

In the present example embodiment, the first wiring structure 120 may include a first contact plug 120a and a first conductive pattern 120b connected to the first FD region 108. The first wiring structure 120 may further include a first via contact 120c connected to the first conductive pattern 120b.

The second wiring structure 122 may include a second contact plug 122a and a second conductive pattern 122b connected to the second FD region 110. The second wiring structure 122 may further include a second via contact 122c connected to the second conductive pattern 122b.

The first TSV 130 may extend through the first surface 1 to the second surface 2 of the semiconductor substrate 100. The first TSV 130 may contact the first via contact 120c.

The first TSV 130 may be disposed in a first hole 128 extending through the semiconductor substrate 100. The first TSV 130 may include a first insulating spacer 130a on a sidewall of the first hole 128 and a third conductive pattern 130b filling an inner space of the first hole 128. The first insulating spacer 130a may cover a sidewall of the third conductive pattern 130b. The first TSV 130 may have a width gradually decreasing from the second surface 2 of the semiconductor substrate 100 to the first surface 1 of the semiconductor substrate 100. The first TSV 130 may not overlap the color filter 146 in the vertical direction.

In the present example embodiment, the first insulating spacer 130a may include, e.g., silicon oxide and/or silicon nitride. In the present example embodiment, the third conductive pattern 130b may include, e.g., doped polysilicon. In some embodiments, the third conductive pattern 130b may include, e.g., a metal or a metal nitride. The metal may include, e.g., aluminum, copper, tungsten, etc.

In the present example embodiment, a first surface of the third conductive pattern 130b may be spaced apart from the second surface 2 of the semiconductor substrate 100 to be placed in an inner portion of the semiconductor substrate 100. The first via contact 120c may extend from the first conductive pattern 120b to the first surface of the third conductive pattern 130b.

The third conductive pattern 130b and the first insulating spacer 130a of the first TSV 130 and the semiconductor substrate 100 may form a capacitor. Thus, the first TSV 130 may serve as the first capacitor CAP1 for a storage region of photocharges, e.g., the first FD region 108.

In each unit pixel, when the capacitance of the first capacitor CAP1 decreases, the conversion gain that may show the efficiency for converting the photocharges into pixel signals may increase. Thus, the sensitivity of the first organic photodiode 170 may be enhanced by reducing the capacitance of the first capacitor CAP1.

A thickness of the first insulating spacer 130a from the sidewall of the first hole 128 may be increased so that the capacitance of the first capacitor CAP1 may be decreased. The first insulating spacer 130a may include a material having a dielectric constant lower than that of, e.g., silicon nitride. The first insulating spacer 130a may have a first thickness.

In a plan view, as shown in FIG. 2, the unit pixel regions may have a lattice pattern, and each unit pixel region may be surrounded by the deep trench isolation pattern 140. In the present example embodiment, the deep trench isolation pattern 140 may not be continuous at an area at which the first TSV 130 is disposed.

The deep trench isolation pattern 140 may be disposed in a second hole extending through the second surface 2 of the semiconductor substrate 100 to the first surface 1 of the semiconductor substrate 100. The deep trench isolation pattern 140 may include a second insulating spacer 140a on a sidewall of the second hole and a fourth conductive pattern 140b filling an inner space of the second hole. The second insulating spacer 140a may cover a sidewall of the fourth conductive pattern 140b. The deep trench isolation pattern 140 may have a width gradually decreasing from the second surface 2 of the semiconductor substrate 100 to the first surface 1 of the semiconductor substrate 100.

In the present example embodiment, the second insulating spacer 140a may include silicon oxide and/or silicon nitride. In some embodiments, the second insulating spacer 140a may include a metal oxide having a dielectric constant greater than that of silicon nitride. The metal oxide may include, e.g., hafnium oxide, zirconium oxide, aluminum oxide, titanium oxide, etc., and the deep trench isolation pattern 140 may have a high capacitance. In the present example embodiment, the fourth conductive pattern 140b may include, e.g., doped polysilicon. In some embodiments, the fourth conductive pattern 140b may include, e.g., a metal or a metal nitride.

In the present example embodiment, a first surface of the fourth conductive pattern 140b may be spaced apart from the second surface 2 of the semiconductor substrate 100 to be placed in an inner portion of the semiconductor substrate 100. The second via contact 122c may extend from the second conductive pattern 122b to the first surface of the fourth conductive pattern 140b.

In the present example embodiment, the deep trench isolation pattern 140 may have a width smaller than that of the first TSV 130.

At least a portion of the fourth conductive pattern 140b of the deep trench isolation pattern 140 may contact the second via contact 122c. Thus, the deep trench isolation pattern 140 may serve as a wiring electrically connected to the second organic photodiode 172.

The fourth conductive pattern 140b and the second insulating spacer 140a of the deep trench isolation pattern 140 and the semiconductor substrate 100 may form a capacitor. Thus, the deep trench isolation pattern 140 may serve as the second capacitor CAP2 for a storage region of photocharges, e.g., the second FD region 110.

The second capacitor CAP2 may surround at least part of the unit pixel region, and thus may have an area greater than that of the first capacitor CAP1. Thus, the second capacitor CAP2 may have a capacitance greater than that of the first capacitor CAP1.

The sensitivity of the second organic photodiode 172 may be reduced by increasing the capacitance of the second capacitor CAP2.

A second thickness of the second insulating spacer 140a from the second hole may be smaller than the first thickness of the first insulating spacer 130a so that the capacitance of the second capacitor CAP2 may be relatively increased.

In the present example embodiment, the first and second insulating spacers 130a and 140a may include substantially the same material. In some embodiments, the first and second insulating spacers 130a and 140a may include different materials, and a dielectric constant of the second insulating spacer 140a may be greater than that of the first insulating spacer 130a.

In the present example embodiment, the third and fourth conductive patterns 130b and 140b may include substantially the same material or different materials.

In the present example embodiment, a pad 142 may be formed on the first surface 1 of the semiconductor substrate 100, and may be electrically connected to the fourth conductive pattern 140b of the deep trench isolation pattern 140.

A third via contact 150 may connect the first lower transparent electrode 160 and the first TSV 130. The third via contact 150 may extend through the first and second insulating interlayers 144 and 148. Thus, the first organic photodiode 170 may be electrically connected to the First FD region 108 through the third via contact 150 and the first TSV 130.

A fourth via contact 152 may connect the second lower transparent electrode 162 and the deep trench isolation pattern 140. The fourth via contact 152 may extend through the first and second insulating interlayers 144 and 148. Thus, the second organic photodiode 172 may be electrically connected to the second FD region 110 through the fourth via contact 152 and the deep trench isolation pattern 140.

When a light is irradiated on the first and second organic photodiodes 170 and 172 under the same illumination intensity conditions, photocharges generated from the first organic photodiode 170 may be diffused into the first FD region 108, and photocharges generated from the second organic photodiode 172 may be diffused into the second FD region 110.

The first organic photodiode 170 may be connected to the first TSV 130 having a relatively low capacitance. Thus, the conversion gain for converting the photocharges generated from the first organic photodiode 170 into voltage signals may be increased. Accordingly, as shown in FIG. 3, the voltage of the first FD region 108 may increase, and the first organic photodiode 170 may have a relatively higher sensitivity signal.

The second organic photodiode 172 may be connected to the deep trench isolation pattern 140 having a relatively high capacitance. Thus, the conversion gain for converting the photocharges generated from the second organic photodiode 172 into voltage signals may be relatively decreased. Accordingly, as shown in FIG. 3, the voltage of the second FD region 110 may decrease, and the second organic photodiode 172 may have a relatively lower sensitivity signal.

In the present example embodiment, the voltage of the first FD region 108 may be applied to a gate of a first drive transistor serving as a first source follow SF1. Thus, a first output voltage Vout1 may be output according to the on/off operations of a first selection transistor SEL1.

In the present example embodiment, the voltage of the second FD region 110 may be applied to a gate of a second drive transistor serving as a second source follow SF2. Thus, a second output voltage Vout2 may be output according to the on/off operations of a second selection transistor SEL2.

Two output voltages Vout1 and Vout2 may be output from one unit pixel, and a further data processing may be performed on the two output voltages Vout1 and Vout2 to gain a final output voltage.

Likewise, the unit pixel may include both of the first organic photodiode 170 producing a relatively high sensitivity and the second organic photodiode 172 producing a relatively low sensitivity, and thus a wide dynamic range (WDR) data may be provided.

Figure 4:
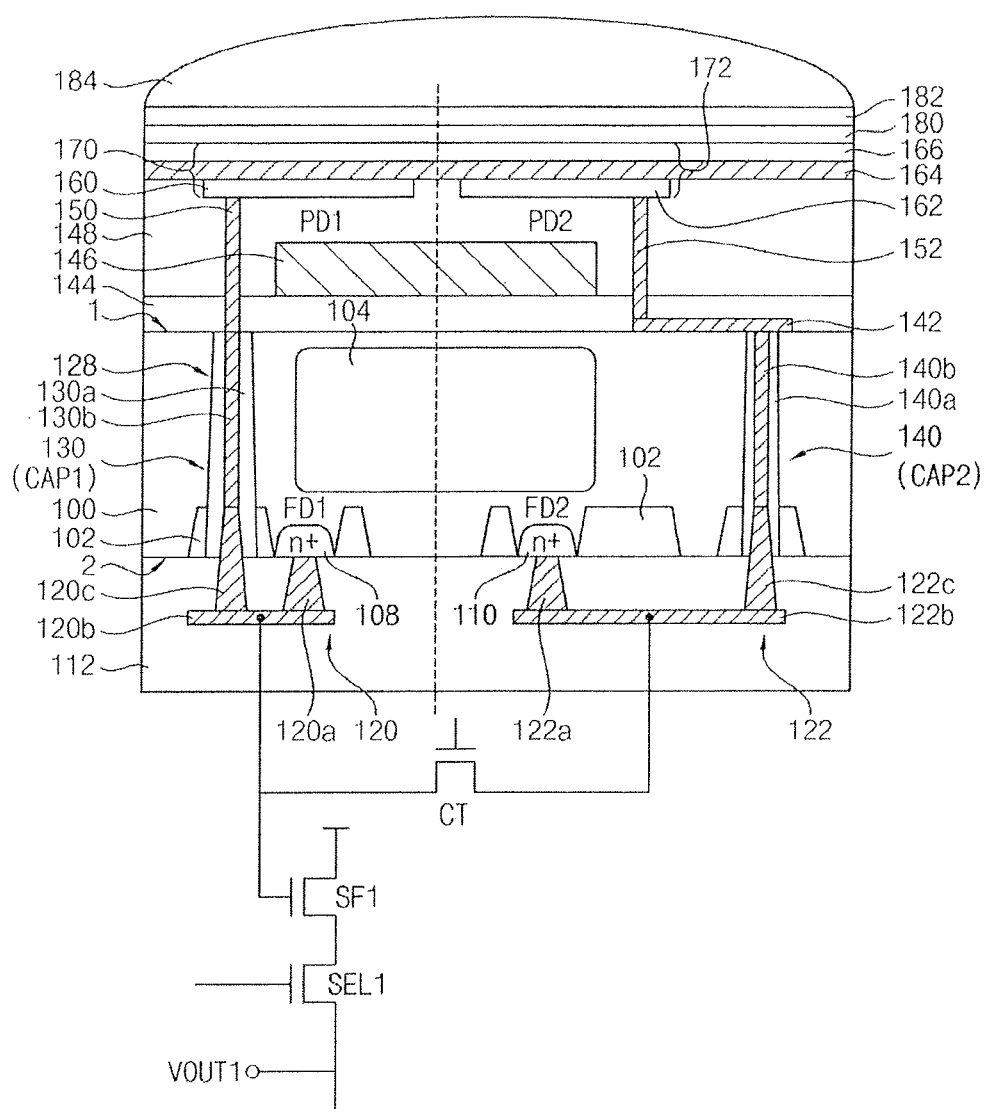
FIG. 4 illustrates a unit pixel of an image sensor in accordance with an example embodiment.
Figure 5A:
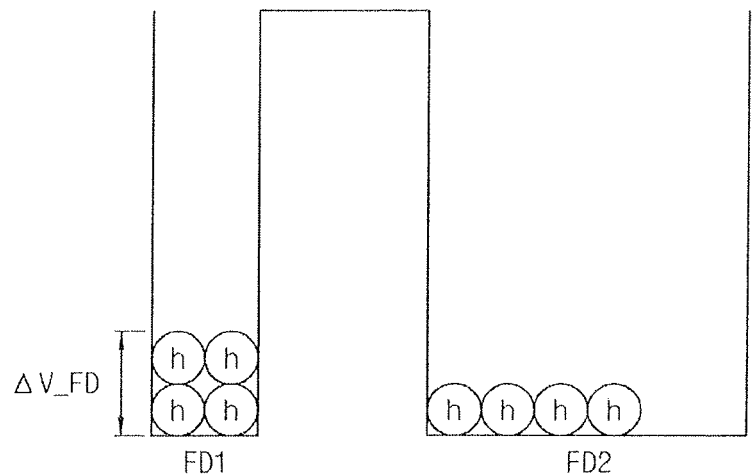
FIGS. 5A and 5B illustrate voltages of first and second FD regions of the unit pixel of the image sensor of FIG. 4.
Figure 5B:
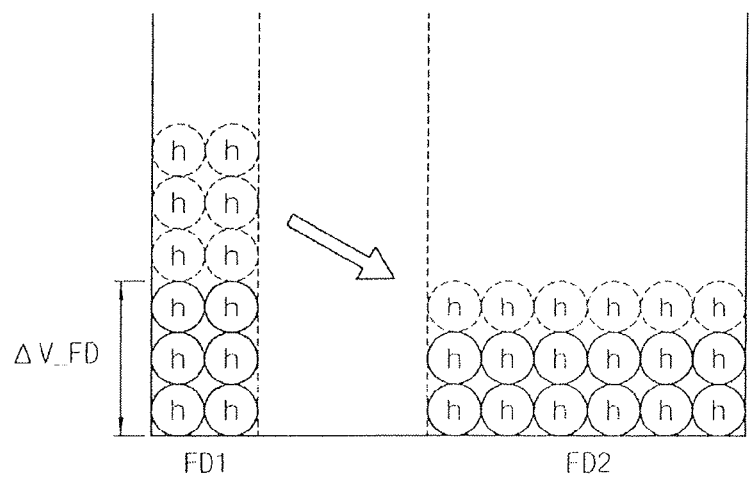

FIG. 4 shows a unit pixel of an image sensor in accordance with an example embodiment. FIGS. 5A and 5B show voltages of first and second FD regions of the unit pixel of the image sensor of FIG. 4.

FIG. 5A shows voltages of the first and second FD regions under a low illumination intensity, and FIG. 5B shows voltages of the first and second FD regions under a high illumination intensity.

The unit pixel of the image sensor of FIG. 4 may be substantially the same as that of the image sensor of FIG. 1, except for the transistors electrically connected to the first and second organic photodiodes.

Referring to FIG. 4, each unit pixel may include the first and second organic photodiodes 170 and 172 having high and low sensitivities, respectively. The first organic photodiode 170 may be electrically connected to the first TSV 130 having the first capacitance, and the second organic photodiode 172 may be electrically connected to the deep trench isolation pattern 140 having the second capacitance greater than the first capacitance.

In the present example embodiment, photocharges generated from the first organic photodiode 170 may be diffused into the first FD region 108, and the voltage of the first FD region 108 may be applied to the gate of the first drive transistor serving as the first source follow SF1. Thus, the first output voltage Vout1 may be output according to the on/off operations of the first selection transistor SEL1.

In the present example embodiment, a control transistor CT may be connected to the second FD region 110 and the gate of the first drive transistor. Thus, only when the control transistor CT is turned on, the voltage of the second FD region 110 may be applied to the gate of the first drive transistor.

As shown in FIG. 5A, when a light having a low illumination intensity is incident on the first and second organic photodiodes 170 and 172, the voltage of the first FD region 108 may be greater than that of the second FD region 110. Thus, images may be preferably generated through the first organic photodiode 170 having a high sensitivity under low illumination intensity conditions. Accordingly, the control transistor CT may be turned off under the low illumination intensity conditions.

As shown in FIG. 5B, when a light having a high illumination intensity is incident on the first and second organic photodiodes 170 and 172, the control transistor CT may be turned on. Thus, photocharges of the first FD region 108 may move to the second FD region 110. Accordingly, the voltage of the first FD region 108 may decrease, and the voltage of the second FD region 110 may increase, so that the voltages of the first and second FD regions 108 and 110 may become equal. Likewise, when the control transistor CT is turned on, images may be generated through the first and second organic photodiodes 170 and 172, and the image sensor may have a low sensitivity.

Figure 6A:
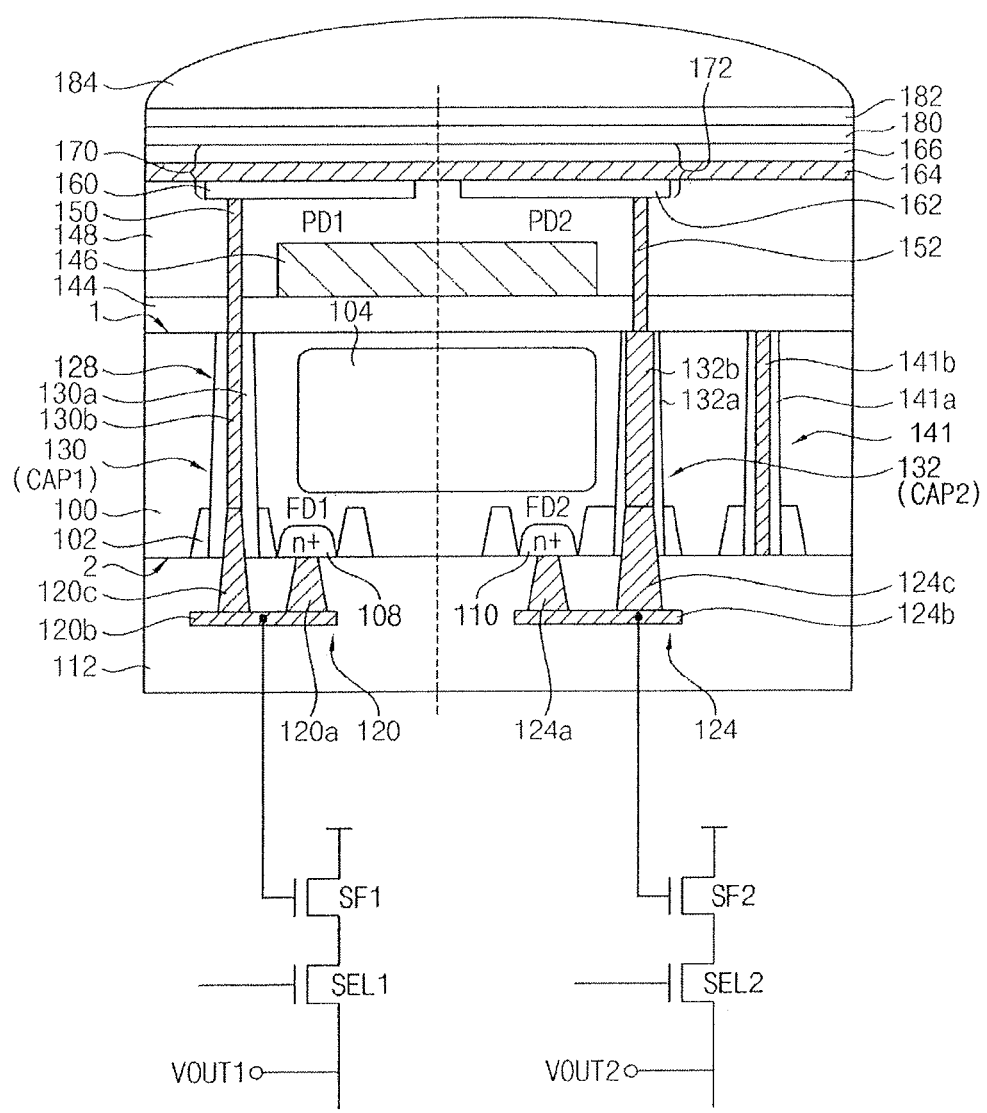
FIG. 6A illustrates a unit pixel of an image sensor in accordance with an example embodiment.
Figure 6B:
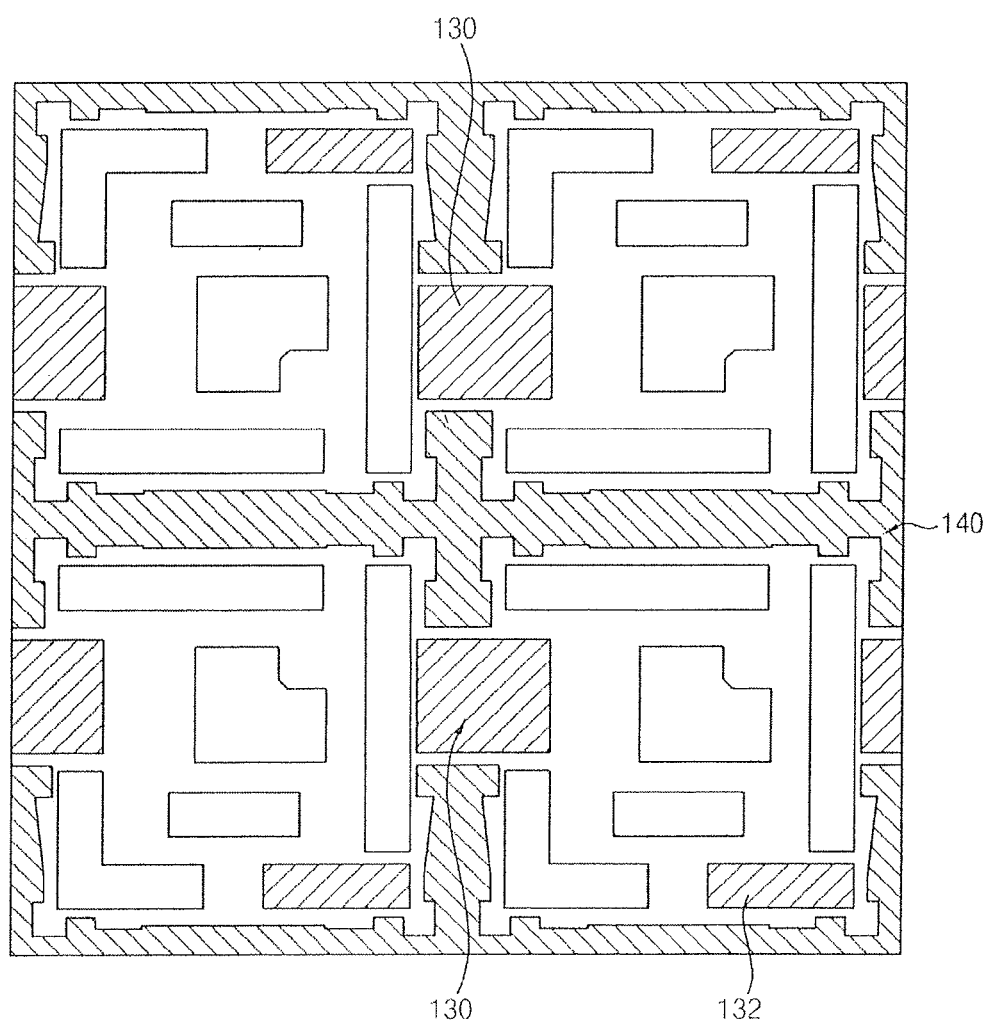
FIG. 6B illustrates a layout of the unit pixels of the image sensor in accordance with an example embodiment.

FIG. 6A shows a unit pixel of an image sensor in accordance with an example embodiment. FIG. 6B shows a layout of the unit pixels of the image sensor in accordance with an example embodiment.

The unit pixel of the image sensor of FIG. 6A may be substantially the same as that of the image sensor of FIG. 1, except for a second TSV and the connection to the deep trench isolation pattern.

Referring to FIGS. 6A and 6B, each unit pixel may include the first and second organic photodiodes 170 and 172 having high and low sensitivities, respectively.

The first organic photodiode 170 may be electrically connected to the first TSV 130 having the first capacitance. The first TSV 130 may serve as the first capacitor CAP1 having the first capacitance.

A second TSV 132 may extend from the second surface 2 of the semiconductor substrate 100 to the first surface 1 of the semiconductor substrate 100. The second TSV 132 may be electrically connected to the second organic photodiode 172 through the fourth via contact 152. The second TSV 132 may be electrically connected to the second wiring structure 124 on the second surface 2 of the semiconductor substrate 100. The second TSV 132 may serve as the second capacitor CAP2 having the second capacitance greater than the first capacitance.

The second TSV 132 may be disposed in a third hole extending through the semiconductor substrate 100. The second TSV 132 may include a third insulating spacer 132a on a sidewall of the third hole and a fifth conductive pattern 132b filling an inner space of the third hole. The third insulating spacer 132a may surround a sidewall of the fifth conductive pattern 132b.

In the present example embodiment, the second TSV 132 may have a width different from that of the first TSV 130. In some embodiments, the first and second TSVs 130 and 132 may have substantially the same width.

The second TSV 132 may have a width gradually decreasing from the second surface 2 of the semiconductor substrate 100 to the first surface 1 of the semiconductor substrate 100. The second TSV 132 may not overlap the color filter 146 on the first surface 1 of the semiconductor substrate 100 in the vertical direction.

In the present example embodiment, the third insulating spacer 132a may include, e.g., silicon oxide and/or silicon nitride. In some embodiments, the third insulating spacer 132a may include, e.g., a metal oxide having a dielectric constant greater than that of silicon nitride. The metal oxide may include, e.g., hafnium oxide, zirconium oxide, aluminum oxide, titanium oxide, etc., and the second TSV 132 may have a high capacitance.

The fifth conductive pattern 132b may include, e.g., doped polysilicon.

In the present example embodiment, a first surface of the fifth conductive pattern 132b may be spaced apart from the second surface 2 of the semiconductor substrate 100 to be placed in an inner portion of the semiconductor substrate 100. A second via contact 124c may extend from the second conductive pattern 124b to the first surface of the fifth conductive pattern 132b.

The third insulating spacer 132a may have a thickness smaller than the first thickness of the first insulating spacer 130a so that the second capacitor CAP2 may have a relatively increased capacitance.

In the present example embodiment, the first and third insulating spacers 130a and 132a may include substantially the same material. In some embodiments, the first and third insulating spacers 130a and 132a may include different materials, and a dielectric constant of the third insulating spacer 132a may be greater than that of the first insulating spacer 130a.

A deep trench isolation pattern 141 may be disposed in a fourth hole extending from the second surface 2 of the semiconductor substrate 100 to the first surface 1 of the semiconductor substrate 100.

The deep trench isolation pattern 141 may include the second insulating spacer 141a on a sidewall of the fourth hole and the fourth conductive pattern 141b filling an inner space of the fourth hole. The deep trench isolation pattern 141 may have a width gradually decreasing from the second surface 2 of the semiconductor substrate 100 to the first surface 1 of the semiconductor substrate 100.

The deep trench isolation pattern 141 may not be electrically connected to the second organic photodiode 172. Thus, the deep trench isolation pattern 141 may not serve as the second capacitor CAP2.

The unit pixel may include transistors electrically connected to the first and second organic photodiodes 170 and 172.

In the present example embodiment, the transistors may be formed on the semiconductor substrate 100 as shown in FIG. 1. In some embodiments, the transistors may be formed on the semiconductor substrate 100 as shown in FIG. 4.

Figure 7:
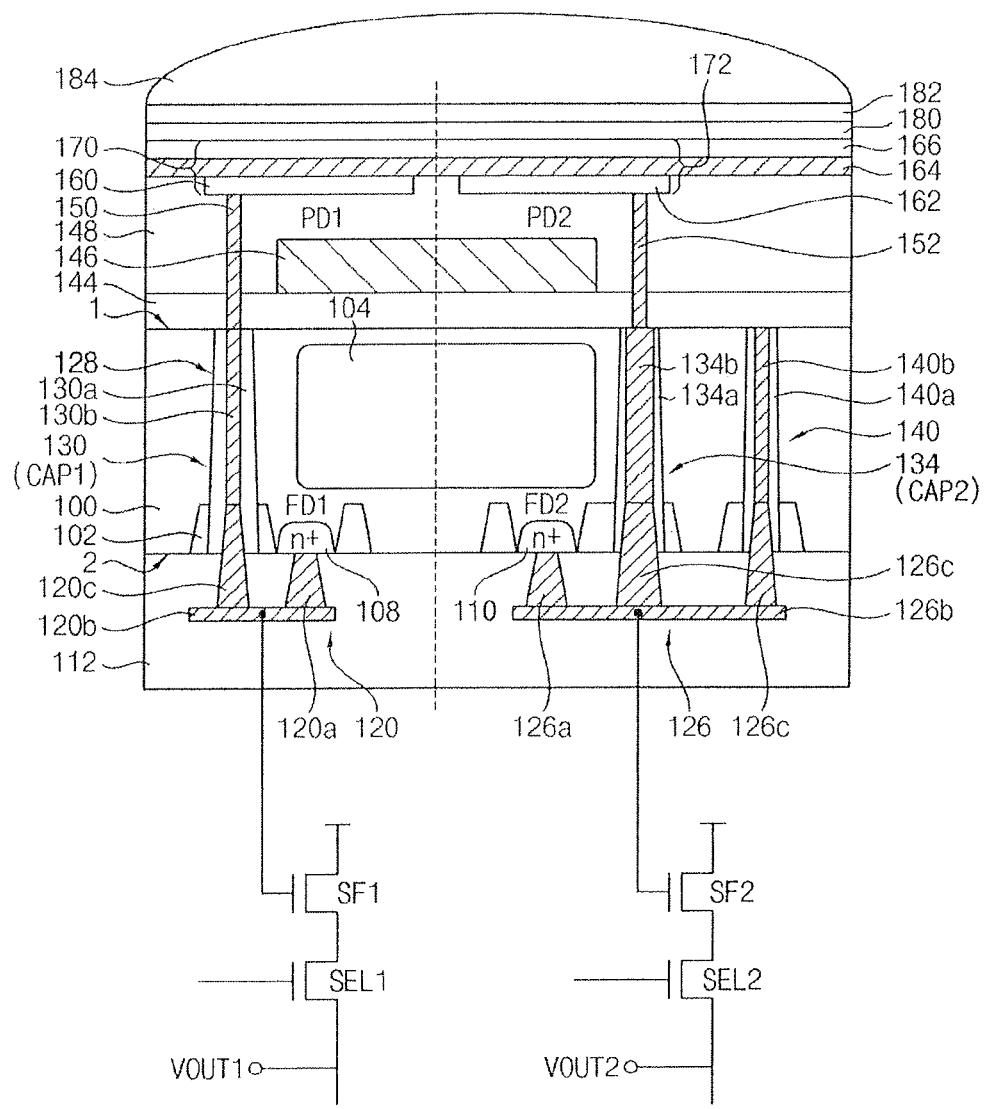
FIG. 7 illustrates a unit pixel of an image sensor in accordance with an example embodiment.

FIG. 7 shows a unit pixel of an image sensor in accordance with an example embodiment.

The unit pixel of the image sensor of FIG. 7 may be substantially the same as that of the image sensor of FIG. 1, except for a second TSV and a second wiring structure.

Referring to FIG. 7, each unit pixel may include the first and second organic photodiodes 170 and 172 having high and low sensitivities, respectively. The first organic photodiode 170 may be electrically connected to the first TSV 130 having the first capacitance.

A second TSV 134 may extend from the second surface 2 of the semiconductor substrate 100 to the first surface 1 of the semiconductor substrate 100. The second TSV 134 may be electrically connected to a second wiring structure 126.

The second TSV 134 may include a third insulating spacer 134a and a fifth conductive pattern 134b In the present example embodiment, the third insulating spacer 134a may have a width substantially the same as that of the first insulating spacer 130a of the first TSV 130. In some embodiments, the third insulating spacer 134a may have a thickness smaller than that of the first insulating spacer 130a.

In the present example embodiment, the first and third insulating spacers 130a and 134a may include substantially the same material. In some embodiments, the first and third insulating spacers 130a and 134a may include different materials, and a dielectric constant of the third insulating spacer 134a may be greater than that of the first insulating spacer 130a.

The second TSV 134 may have a capacitance substantially equal to or greater than the first capacitance of the first TSV 130.

The deep trench isolation pattern 140 may be disposed in the second hole extending from the second surface 2 of the semiconductor substrate 100 to the first surface 1 of the semiconductor substrate 100. The deep trench isolation pattern 140 may include the second insulating spacer 140a on the sidewall of the second hole and the fourth conductive pattern 140b filling the inner space of the second hole.

The deep trench isolation pattern 140 may be electrically connected to the second TSV 134. Thus, the deep trench isolation pattern 140 may have a capacitance greater than the first capacitance.

The second TSV 134 and the deep trench isolation pattern 140 may be electrically connected to the second organic photodiode 172. The second TSV 134 and the deep trench isolation pattern 140 connected to each other through the second wiring structure 126 may serve as the second capacitor CAP2.

The second TSV 134 and the deep trench isolation pattern 140 may be connected to the second FD region 110. The second capacitor CAP2 may have a capacitance greater than the first capacitance.

Each unit pixel may include transistors electrically connected to the first and second organic photodiodes 170 and 172.

In the present example embodiment, the transistors may be formed on the semiconductor substrate 100 as shown in FIG. 1. In some embodiments, the transistors may be formed on the semiconductor substrate 100 as shown in FIG. 4.

Figure 8:
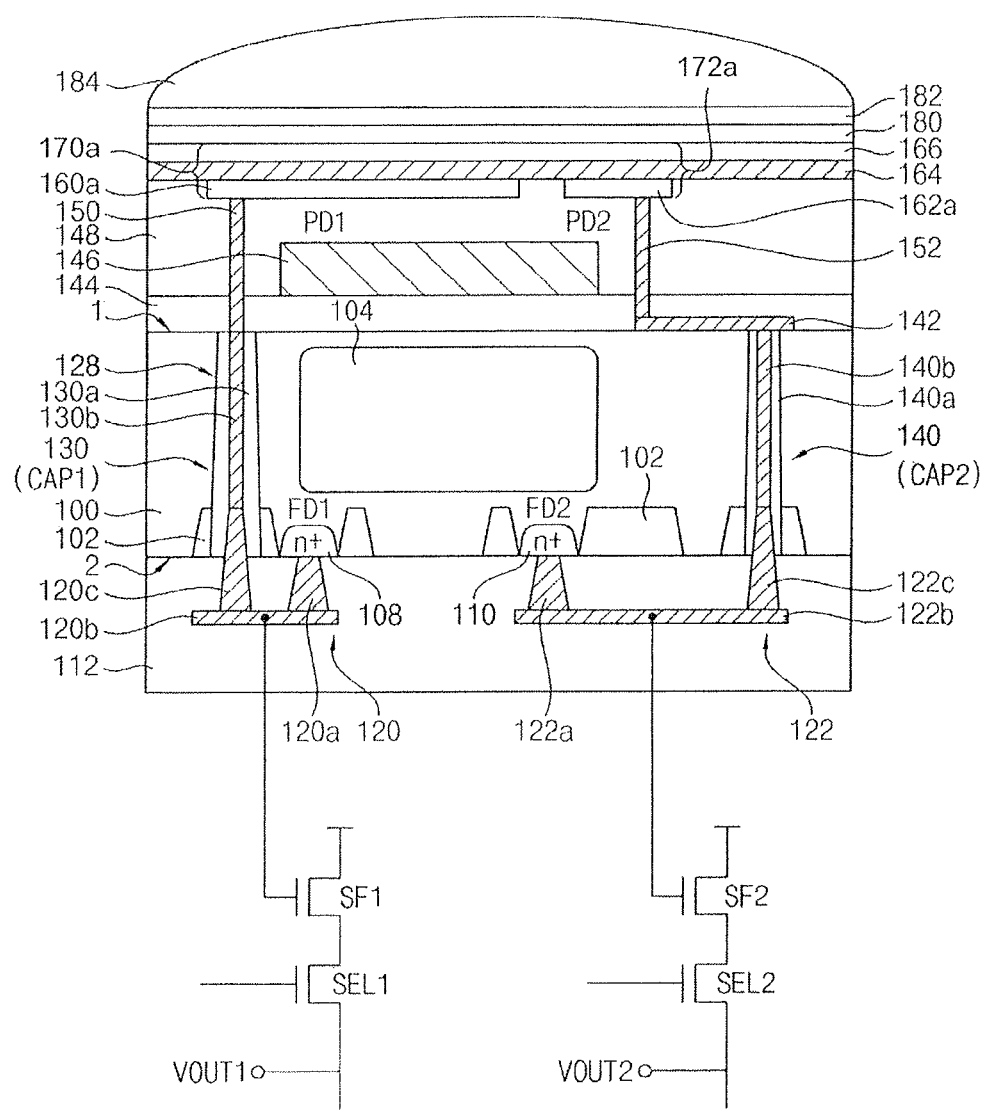
FIG. 8 illustrates a unit pixel of an image sensor in accordance with an example embodiment.
Figure 9:
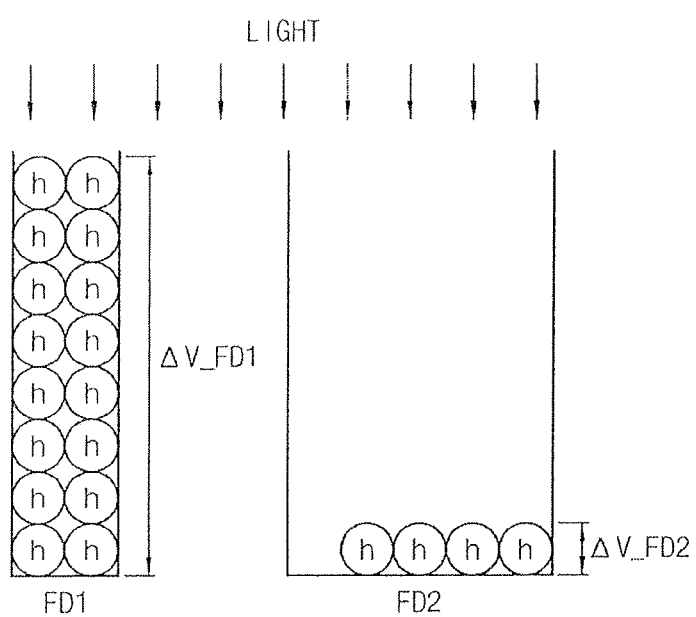
FIG. 9 illustrates voltages of the first and second FD regions of the unit pixel of the image sensor in FIG. 8.

FIG. 8 shows a unit pixel of an image sensor in accordance with an example embodiment. FIG. 9 shows voltages of the first and second FD regions of the unit pixel of the image sensor in FIG. 8.

The unit pixel of the image sensor of FIG. 8 may be substantially the same as that of the image sensor of FIG. 1, except for an area of an upper surface of the lower transparent electrode of the first and second organic photodiodes.

Referring to FIG. 8, each unit pixel may include first and second organic photodiodes 170a and 172a having high and low sensitivities, respectively. The first organic photodiode 170a may include a first lower transparent electrode 160a of which an upper surface may have a first area. The second organic photodiode 172a may include a second lower transparent electrode 162a of which an upper surface may have a second area smaller than the first area.

The first area of the upper surface of the first lower transparent electrode 160a is relatively large, as shown in FIG. 9, and thus the amount of light received by the first organic photodiode 170a may increase so that the voltage of the first FD region FD1 may increase. Accordingly, the sensitivity of the first organic photodiode 170a may be increased. The second area of the upper surface of the second lower transparent electrode 162a is relatively small, and thus the amount of light received by the second organic photodiode 172a may decrease so that the voltage of the second FD region FD2 may decrease. Accordingly, the sensitivity of the second organic photodiode 172a may be decreased.

Each unit pixel may include transistors electrically connected to the first and second organic photodiodes 170a and 172a.

In the present example embodiment, the transistors may be formed on the semiconductor substrate 100 as shown in FIG. 1. In some embodiments, the transistors may be formed on the semiconductor substrate 100 as shown in FIG. 4.

Likewise, the unit pixels of FIGS. 6 and 7 may include the second lower transparent electrode of which an upper surface may have an area smaller than that of an upper surface of the first lower transparent electrode.

Figure 10:
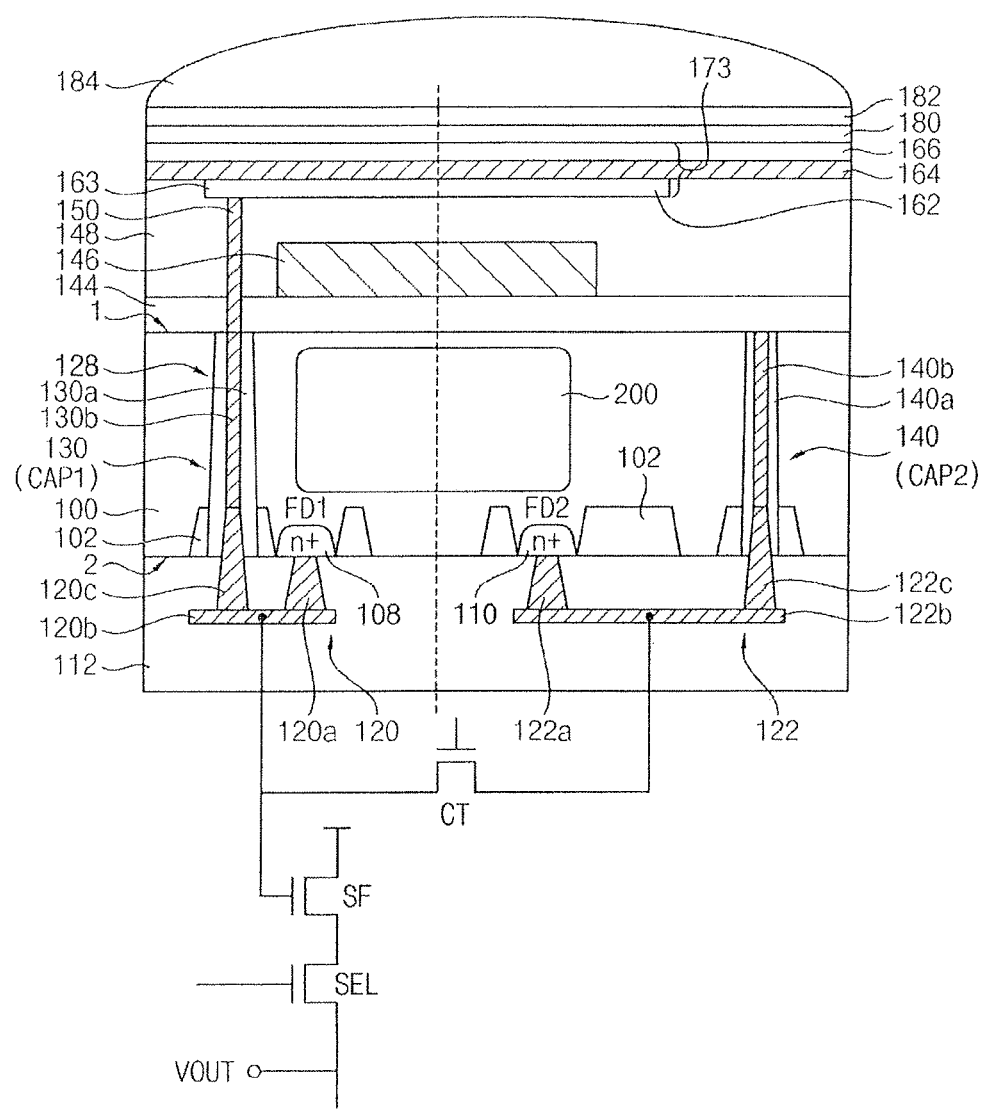
FIG. 10 illustrates a unit pixel of an image sensor in accordance with an example embodiment.
Figure 11A:
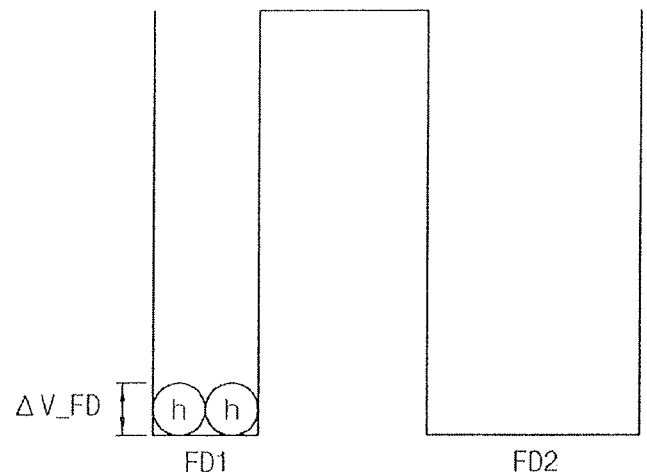
FIGS. 11A and 11B illustrate voltages of the first and second FD regions of the unit pixel of the image sensor in FIG. 10.
Figure 11B:
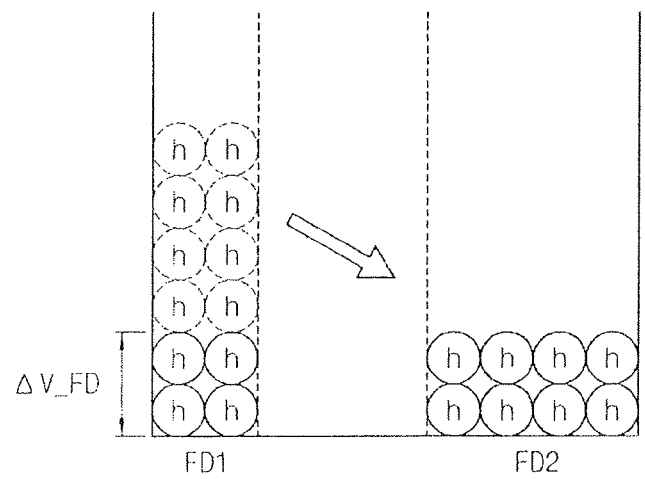

FIG. 10 shows a unit pixel of an image sensor in accordance with an example embodiment. FIGS. 11A and 11B show voltages of the first and second FD regions of the unit pixel of the image sensor in FIG. 10.

Referring to FIG. 10, each unit pixel may include a single organic photodiode 173. The one organic photodiode 173 may have a stacked structure including a lower transparent electrode 163, the organic layer 164, and the upper transparent electrode layer 166 sequentially stacked. The lower transparent electrode 163 may overlap the color filter 146 in the vertical direction. A lower photoelectric conversion element 200 may be disposed in the semiconductor substrate 100.

The capacitor connected to the organic photodiode 173 may have a changing capacitance according to the illumination intensity of light, and thus the organic photodiode 173 may have a changing sensitivity according to the illumination intensity of light.

The first TSV 130 connected to the organic photodiode 173 may serve as the first capacitor CAP1, and the first capacitor CAP1 may have the first capacitance.

The first TSV 130 may be connected to the first wiring structure 120 on the second surface 2 of the semiconductor substrate 100.

The deep trench isolation pattern 140 not directly connected to the organic photodiode 173 may serve as the second capacitor CAP2, and the second capacitor CAP2 may have the second capacitance smaller than the first capacitance.

The deep trench isolation pattern 140 may be connected to the second wiring structure 122 on the second surface 2 of the semiconductor substrate 100. The deep trench isolation pattern 140 may be connected to the second FD region 110 through the second wiring structure 122.

Each unit pixel may include transistors electrically connected to the organic photodiode 173 and the first and second capacitors CAP1 and CAP2. The transistors may be connected to the first wiring structure 120 and/or the second wiring structure 122. The transistors may be formed on the semiconductor substrate 100 as shown in FIG. 1. In some embodiments, the transistors may be formed on the semiconductor substrate 100 as shown in FIG. 4.

As shown in FIG. 11A, when a light having a low illumination intensity is incident on the image sensor, the organic photodiode 173 may have a high sensitivity. Thus, the control transistor CT may be turned off so that only the first capacitor CAP1 having a low capacitance may be connected to the organic photodiode 173. In this case, the voltage of the first FD region 108 may be increased by the light received by the organic photodiode 173. As the capacitance of the capacitor connected to the organic photodiode 173 decreases, the organic photodiode 173 may have a high sensitivity.

As shown in FIG. 11B, when a light having a high illumination intensity is incident on the image sensor, the organic photodiode 173 may have a low sensitivity. Thus, the control transistor CT may be turned off so that both of the first and second capacitors CAP1 and CAP2 may be connected to the organic photodiode 173. In this case, photocharges from the first FD region 108 may move to the second FD region 110. Thus, the voltage of the first FD region 108 may decrease and the voltage of the second FD region 110 may increase so that the voltages of the first and second FD regions 108 and 110 may become substantially equal to each other. Likewise, when the control transistor CT is turned on, the capacitance of the capacitor connected to the organic photodiode 173 may increase so that the organic photodiode 173 may have a low sensitivity. The unit pixel of the image sensor may have one organic photodiode having a low sensitivity or a high sensitivity according to the switching operation of the control transistor.

Figure 12:
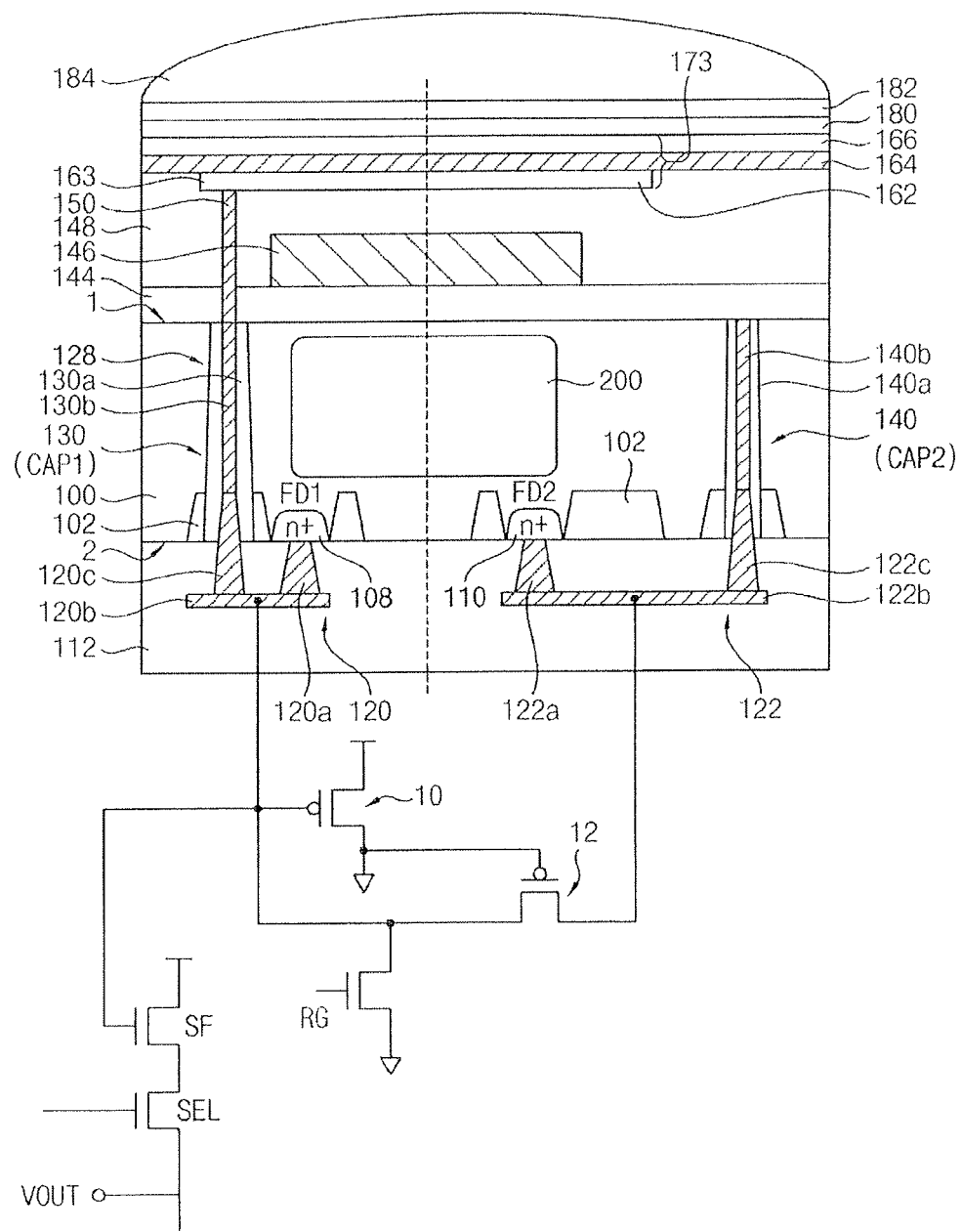
FIG. 12 illustrates a unit pixel of an image sensor in accordance with an example embodiment.
Figure 13:
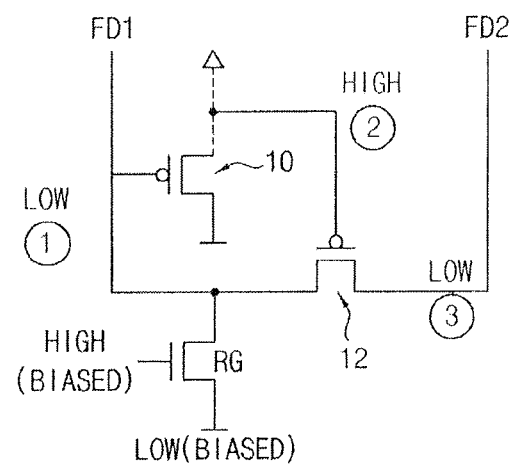
FIG. 13 illustrates transistors connected to each unit pixel.
Figure 14A:
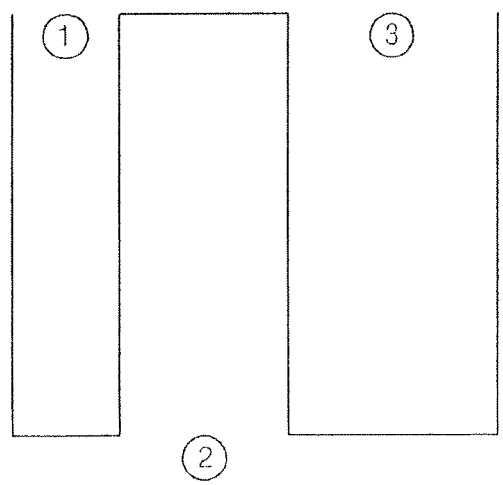
FIGS. 14A, 14B, and 14C illustrate voltages at respective nodes of the transistors in FIG. 10.
Figure 14B:
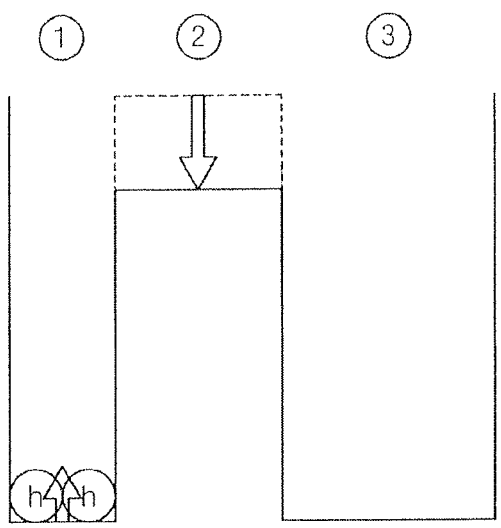
Figure 14C:
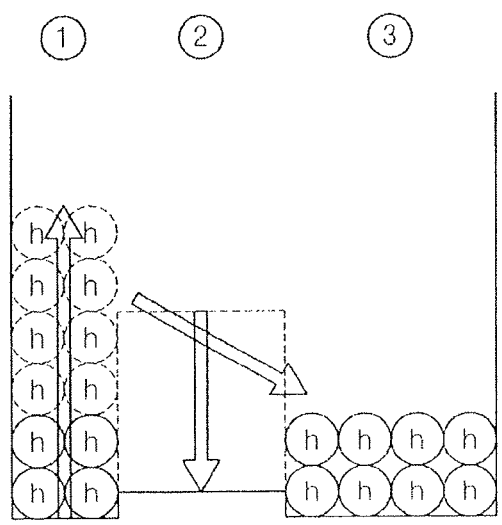

FIG. 12 shows a unit pixel of an image sensor in accordance with an example embodiment. FIG. 13 shows transistors connected to each unit pixel. FIGS. 14A, 14B, and 14C show voltages at respective nodes of the transistors in FIG. 10.

The image sensor of FIG. 12 may be substantially the same as that of FIG. 10, except for the organic photodiode 173 in each unit pixel and the transistors electrically connected to the first and second capacitors. Thus, the organic photodiode, the first TSV, the deep trench isolation pattern, and the first and second wiring structures of FIG. 12 may be substantially the same as those of FIG. 10.

Referring to FIG. 12, photocharges generated from the organic photodiode 173 of the unit pixel may be diffused into the first FD region 108, and the voltage of the first FD region 108 may be applied to the gate of the first drive transistor serving as the first source follow SF1. Thus, the first output voltage Vout1 may be output according to the on/off operations of the first selection transistor SEL1.

The voltage of the first FD region 108 may be applied to a gate of an amplifier transistor 10. Output signals from the amplifier transistor 10 may be applied to a gate of a transistor 12 connected to the second FD region 110. The voltage of the first FD region 108 may be supplied as a source voltage of a reset transistor including a reset gate (RG), and thus the photocharges stored in the second FD region 110 may move according to the on/off operations of the reset transistor.

The connection of the second capacitor CAP2 may be controlled according to the amount of light incident onto the organic photodiode 173.

Referring to FIGS. 13 and 14A, when a light of a low illumination intensity or no light is incident onto the organic photodiode 173, the first FD region FD1 may have a low voltage so that the amplifier transistor 10 may be turned on. When the amplifier transistor 10 is turned on, a voltage equal to or greater than a threshold voltage may be applied to the transistor 12 connected to the second FD region FD2. Thus, the first and second FD regions FD1 and FD2 may not be connected to each other, and photocharges of the first FD region FD1 may not move.

Referring to FIG. 14B, when the amount of light incident onto the organic photodiode 173 increases, the voltage of the first FD region FD1 may increase, and thus a low voltage may be applied to the transistor connected to the second FD region FD2.

However, when a light of a high illumination intensity is incident onto the organic photodiode 173, the voltage of the first FD region FD1 may sufficiently increase so that the amplifier transistor 10 may be turned off. When the amplifier transistor 10 is turned off, a voltage smaller than the threshold voltage may be applied to the transistor 12 connected to the second FD region FD2 so that the gate of the transistor 12 may be turned on. Thus, the first and second FD regions FD1 and FD2 may be connected to each other, and photocharges of the first FD region FD1 may move to the second FD region FD2. Accordingly, the voltage of the first FD region FD1 may decrease and the voltage of the second FD region FD2 may increase, so that the voltages of the first and second FD regions FD1 and FD2 may become equal to each other.

Likewise, the connection between the first and second FD regions FD1 and FD2 may be controlled according to the amount of light incident onto the organic photodiode 173. When a light of a low illumination intensity is incident, the first and second FD regions FD1 and FD2 may not be connected to each other, and the first FD region FD1 may be connected to the first capacitor CAP1 so that the image sensor may have a high sensitivity. When a light of a high illumination intensity is incident, the first and second FD regions FD1 and FD2 may be connected to each other, and the first FD region FD1 may be connected to the first and second capacitors CAP1 and CAP2 so that the image sensor may have a low sensitivity.

Figure 15:
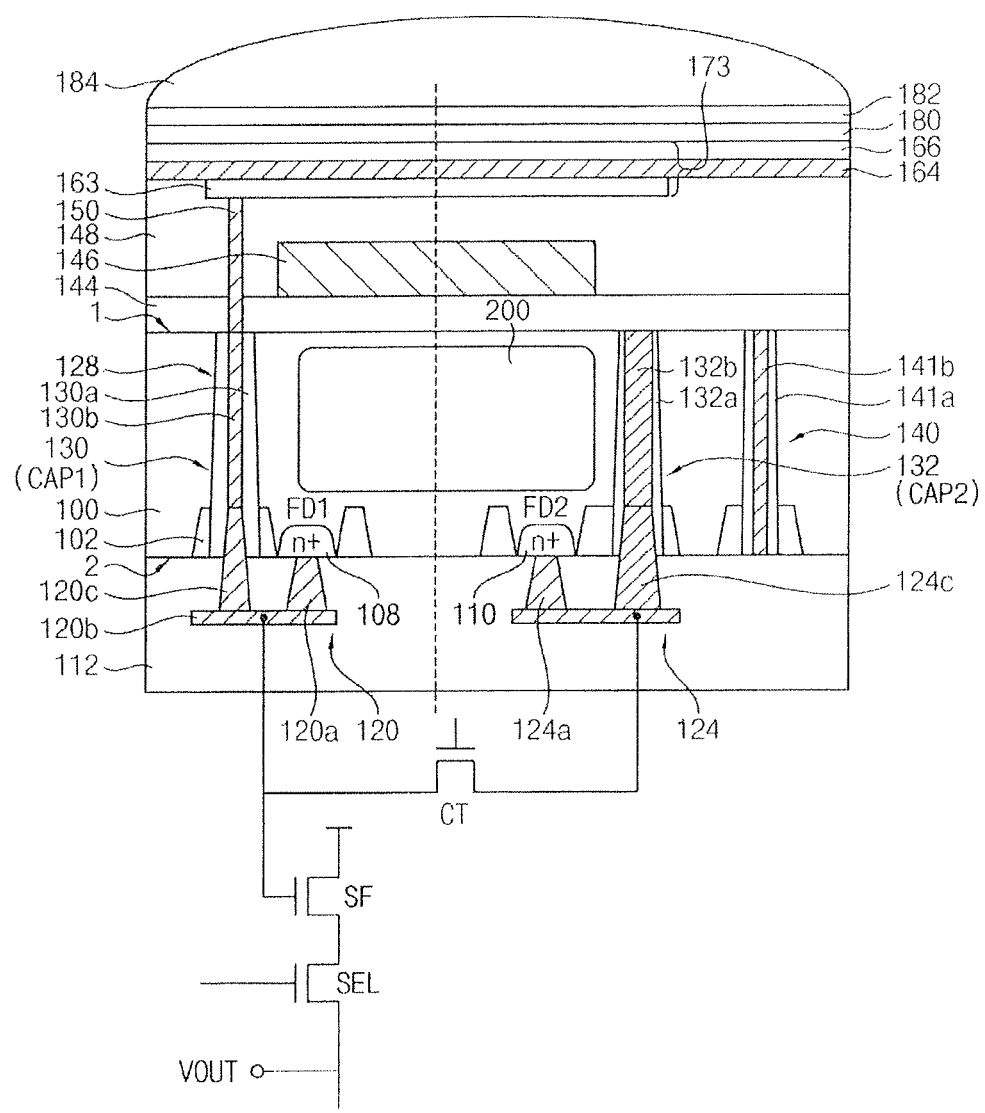
FIG. 15 illustrates a unit pixel of an image sensor in accordance with an example embodiment.

FIG. 15 shows a unit pixel of an image sensor in accordance with an example embodiment.

The unit pixel of FIG. 15 may be substantially the same as that of FIG. 12, except for the second TSV and the connection of the deep trench isolation pattern.

Referring to FIG. 15, each unit pixel may include the organic photodiode 173. The organic photodiode 173 may be connected to the first TSV 130. The first TSV 130 may serve as the first capacitor CAP1 having the first capacitance. The first TSV 130 may be connected to the first wiring structure 120 on the second surface 2 of the semiconductor substrate 100.

The second TSV 132 may be connected to the second wiring structure 124 on the second surface 2 of the semiconductor substrate 100. The second TSV 132 may not be electrically connected to the organic photodiode 172. The second TSV 132 may serve as the second capacitor CAP2 having the second capacitance greater than the first capacitance.

The deep trench isolation pattern 140 may extend through the semiconductor substrate 100. The deep trench isolation pattern 140 may not be electrically connected to the organic photodiode 173 and the wiring structures in the unit pixel. Thus, the deep trench isolation pattern 140 may not serve as the second capacitor.

The first wiring structure 120 may be electrically connected to the first TSV 130, and the second wiring structure 124 may be electrically connected to the second TSV 132.

The unit pixel may include transistors electrically connected to the organic photodiode 173. In the present example embodiment, the transistors may be formed on the semiconductor substrate 100 as shown in FIG. 10. In some embodiments, the transistors may be formed on the semiconductor substrate 100 as shown in FIG. 12.

Figure 16:
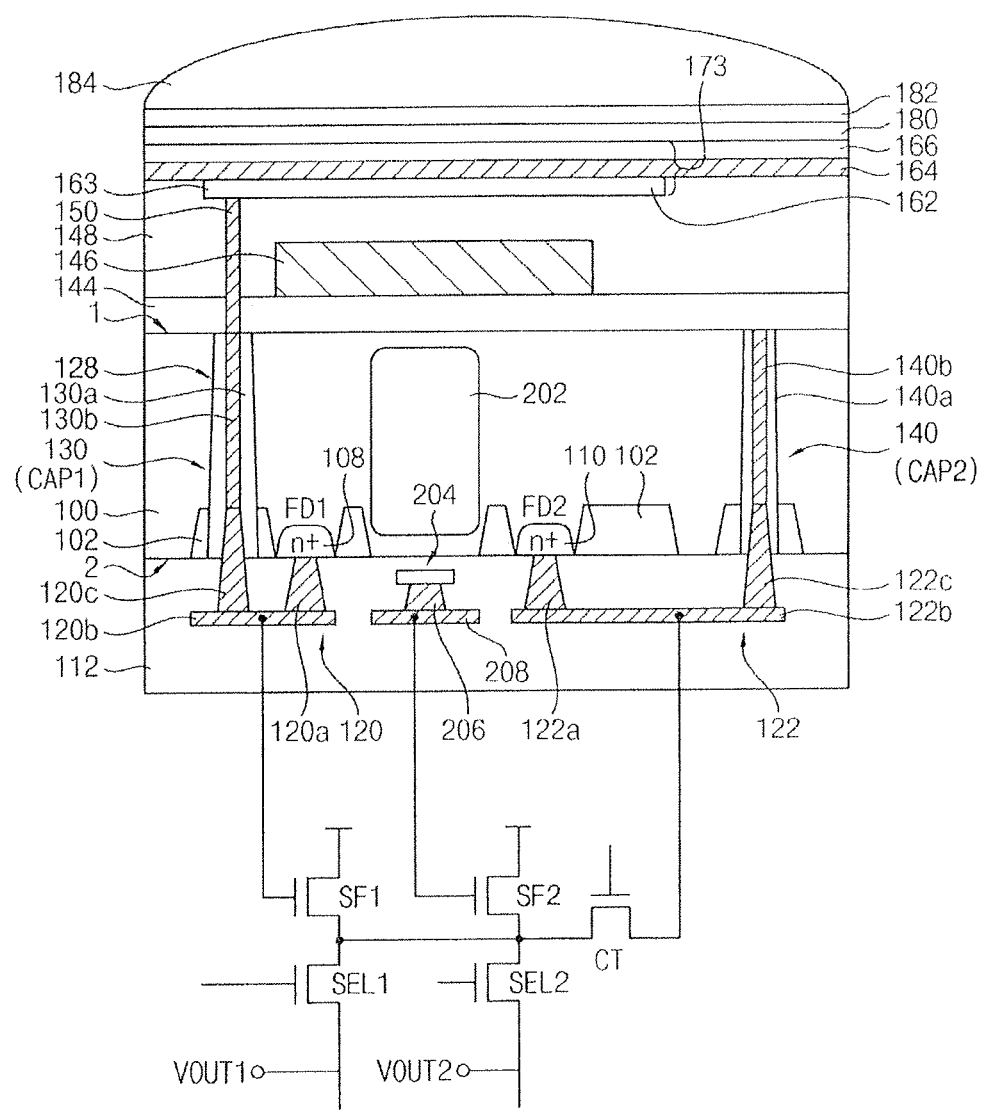
FIG. 16 illustrates a unit pixel of an image sensor in accordance with an example embodiment.

FIG. 16 shows a unit pixel of an image sensor in accordance with an example embodiment.

The unit pixel of FIG. 16 may include an organic photodiode and a silicon photodiode.

Referring to FIG. 16, the organic photodiode 173 may be connected to the first TSV 130 serving as the first capacitor. The first TSV 130 may be connected to the first wiring structure 120 on the second surface 2 of the semiconductor substrate 100. The first wiring structure 120 may be connected to the first FD region 108.

A silicon photodiode 202 may be connected to a third wiring structure 204.

The deep trench isolation pattern 140 may serve as the second capacitor CAP2 having a capacitance greater than that of the first capacitor CAP1. The deep trench isolation pattern 140 may be connected to the second FD region 110 through the second wiring structure 122. The deep trench isolation pattern 140 may not be directly connected to the organic photodiode 173.

The deep trench isolation pattern 140 may be connected to the control transistor CT, and may be electrically connected to the first and third wiring structures 120 and 204 by the switching operation of the control transistor CT.

The unit pixel may include transistors electrically connected to the organic photodiode 173. Additionally, the unit pixel may include transistors electrically connected to the silicon photodiode 202.

Photocharges generated from the organic photodiode 173 may be diffused to the first FD region 108, and the voltage of the first FD region 108 may be applied to the gate of the first drive transistor serving as the first source follow SF1. Thus, the first output voltage Vout1 may be output according to the on/off operations of the first selection transistor SEL1. The second capacitor CAP2 may be connected according to the on/off operations of the control transistor CT.

Photocharges generated from the silicon photodiode 202 may be applied to the gate of the second drive transistor serving as the second source follow SF2. Thus, the second output voltage Vout2 may be output according to the on/off operations of the second selection transistor SEL2. The second capacitor CAP2 may be connected according to the on/off operations of the control transistor CT.

Likewise, the second capacitor CAP2 may be connected to the organic photodiode 173 and the silicon photodiode 202 so that the sensitivity of the image sensor may be controlled. Accordingly, WDR of the image sensor may be effectively performed.

Figure 17:
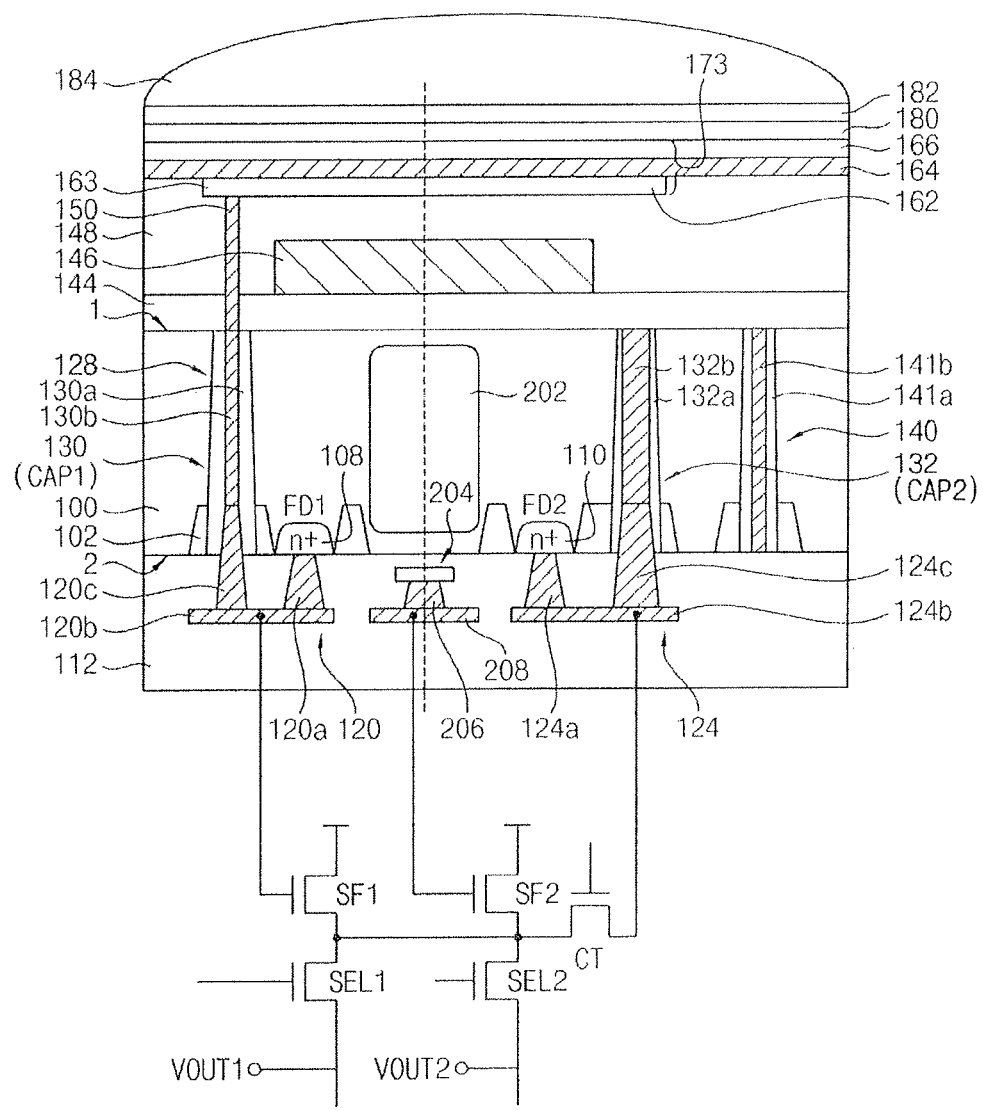
FIG. 17 illustrates a unit pixel of an image sensor in accordance with an example embodiment.

FIG. 17 shows a unit pixel of an image sensor in accordance with an example embodiment.

The unit pixel of FIG. 17 may be substantially the same as that of FIG. 1, except for the second TSV and the connection of the deep trench isolation pattern.

Referring to FIG. 17, the organic photodiode 173 may be connected to the first TSV 130 serving as the first capacitor. The first TSV 130 may be connected to the first wiring structure 120 on the second surface 2 of the semiconductor substrate 100. The first wiring structure 120 may be connected to the first FD region 108.

The silicon photodiode 202 may be connected to the third wiring structure 204.

The second TSV 132 may extend from the second surface 2 of the semiconductor substrate 100 to the first surface 1 of the semiconductor substrate 100. The second TSV 132 may be electrically connected to the second wiring structure 124 on the second surface 2 of the semiconductor substrate 100. The second TSV 132 may be connected to the second FD region 110 through the second wiring structure 124. The second TSV 132 may not be directly connected to the organic photodiode 173. The second TSV 132 may serve as the second capacitor CAP2 having the capacitance greater than that of the first capacitor CAP1. The second TSV 132 may be substantially the same as that of FIG. 6A.

The deep trench isolation pattern 140 may not be directly connected to the organic photodiode 173. Thus, the deep trench isolation pattern 140 may not serve as the second capacitor.

The second TSV 132 may be connected to the control transistor CT, and may be electrically connected to the first and third wiring structures 120 and 204 by the switching operation of the control transistor CT.

The unit pixel may include transistors electrically connected to the organic photodiode 173. Additionally, the unit pixel may include transistors electrically connected to the silicon photodiode 202. The transistors may be substantially the same as those of FIG. 16.

By way of summation and review, an organic image sensor may have small sized pixels, and may exhibit reduced cross-talk and noise. The organic image sensor may have a wide dynamic range (WDR) function, and may provide good images nearly regardless of intensity of illumination.

As described above, according to example embodiments, the image sensor may include a plurality of photodiodes having different conversion gains from each other, and thus may have clear images.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   an organic photodiode on a substrate, the organic photodiode being spaced apart from a first surface of the substrate;
   a first capacitor including a first conductive pattern and a first insulating spacer, the first conductive pattern being electrically connected to the organic photodiode and extending through the substrate, and the first insulating spacer surrounding a sidewall of the first conductive pattern and having a first thickness; and
   a second capacitor including a second conductive pattern and a second insulating spacer, the second conductive pattern extending through the substrate and not being directly connected to the organic photodiode, and the second insulating spacer surrounding a sidewall of the second conductive pattern and having a second thickness smaller than the first thickness.

2. The image sensor as claimed in claim 1, wherein the organic photodiode includes a lower transparent electrode, an organic photodiode layer, and an upper transparent electrode layer sequentially stacked, and
   wherein the lower transparent electrode is electrically connected to the first capacitor.

3. The image sensor as claimed in claim 1, wherein the organic photodiode includes a first lower transparent electrode, a second lower transparent electrode, an organic photodiode layer, and an upper transparent electrode layer, the first and second lower transparent electrodes being spaced apart from each other on a same plane, and
   wherein the first lower transparent electrode, the organic photodiode layer, and the upper transparent electrode layer are sequentially stacked, and the second lower transparent electrode, the organic photodiode layer and the upper transparent electrode layer are sequentially stacked.

4. The image sensor as claimed in claim 3, wherein the first lower transparent electrode is electrically connected to the first capacitor.

5. The image sensor as claimed in claim 4, further comprising a third capacitor including a third conductive pattern and a third insulating spacer, the third conductive pattern extending through the substrate and being electrically connected to the second lower transparent electrode, and the third insulating spacer surrounding a sidewall of the third conductive pattern and having a third thickness smaller than the first thickness.

6. The image sensor as claimed in claim 3, further comprising a microlens on the organic photodiode, the microlens overlapping both of the first and second lower transparent electrodes in a vertical direction to the first surface of the substrate.

7. The image sensor as claimed in claim 1, wherein the first capacitor includes a first through silicon via in a unit pixel region, and the second capacitor includes a deep trench isolation pattern surrounding the unit pixel region.

8. The image sensor as claimed in claim 1, wherein the first capacitor has a first capacitance, and the second capacitor has a second capacitance greater than the first capacitance.

9. The image sensor as claimed in claim 1, further comprising:
   a first floating diffusion (FD) region in the substrate, the first FD region being proximate to a second surface of the substrate opposite to the first surface of the substrate, the first FD region being electrically connected to the first capacitor;
   a second FD region in the substrate, the second FD region being proximate to the second surface of the substrate, the second FD region being electrically connected to the second capacitor;
   a first circuit on the second surface of the substrate, the first circuit being electrically connected to the first FD region; and
   a second circuit on the second surface of the substrate, the second circuit being electrically connected to the second FD region and including a control transistor controlling an electrical connection between the second FD region and the first circuit.

10. The image sensor as claimed in claim 1, further comprising:
   a semiconductor photodiode in the substrate;
   a wiring structure on a second surface of the substrate opposite to the first surface of the substrate, the wiring structure being electrically connected to the semiconductor photodiode; and
   a circuit on the second surface of the substrate, the circuit being electrically connected to the wiring structure,
   wherein the circuit is electrically connected to the second capacitor through a control transistor.

11. The image sensor as claimed in claim 1, further comprising a via contact electrically connecting the first capacitor to the organic photodiode, the via contact directly contacting the first capacitor and the organic photodiode.

12. An image sensor, comprising:
   a first organic photodiode on a substrate, the first organic photodiode being spaced apart from a surface of the substrate;
   a second organic photodiode on a substrate, the second organic photodiode being spaced apart from the surface of the substrate;
   a first capacitor electrically connected to the first organic photodiode, the first capacitor including a first conductive pattern and a first insulating spacer, the first conductive pattern extending through the substrate, and the first insulating spacer surrounding a sidewall of the first conductive pattern and having a first thickness; and
   a second capacitor electrically connected to the second organic photodiode, the second capacitor including a second conductive pattern and a second insulating spacer, the second conductive pattern extending through the substrate, and the second insulating spacer surrounding a sidewall of the second conductive pattern and having a second thickness smaller than the first thickness.

13. The image sensor as claimed in claim 12, wherein the first capacitor includes a first through silicon via in a unit pixel region, and the second capacitor includes a deep trench isolation pattern surrounding the unit pixel region.

14. The image sensor as claimed in claim 12, wherein the first capacitor has a first capacitance, and the second capacitor has a second capacitance greater than the first capacitance.

15. The image sensor as claimed in claim 12, wherein the first capacitor includes a first through silicon via in a unit pixel region, and the second capacitor includes a second through silicon via in the unit pixel region.

16. The image sensor as claimed in claim 12, wherein the first organic photodiode includes a first lower transparent electrode, an organic photodiode layer, and an upper transparent electrode layer sequentially stacked, and the second organic photodiode includes a second lower transparent electrode, the organic photodiode layer, and the upper transparent electrode layer sequentially stacked, and
   wherein the organic photodiode layer and the upper transparent electrode layer are common to the first and second organic photodiodes.

17. The image sensor as claimed in claim 16, wherein the first and second lower transparent electrodes are spaced apart from each other on a same plane, and
   wherein the first lower transparent electrode is electrically connected to the first capacitor, and the second lower transparent electrode is electrically connected to the second capacitor.

18. An image sensor, comprising:
   a first organic photodiode on a substrate, the first organic photodiode being spaced apart from a surface of the substrate;
   a second organic photodiode on a substrate, the second organic photodiode being spaced apart from the surface of the substrate;
   a microlens on the first and second organic photodiodes, the microlens overlapping both of the first and second organic photodiodes in a vertical direction to the surface of the substrate;
   a first capacitor electrically connected to the first organic photodiode, the first capacitor including a first conductive pattern and a first insulating spacer, the first conductive pattern extending through the substrate, and the first insulating spacer surrounding a sidewall of the first conductive pattern and having a first thickness; and
   a second capacitor electrically connected to the second organic photodiode, the second capacitor including a second conductive pattern and a second insulating spacer, the second conductive pattern extending through the substrate, and the second insulating spacer surrounding a sidewall of the second conductive pattern and having a second thickness smaller than the first thickness.

19. The image sensor as claimed in claim 18, wherein:
   the first organic photodiode includes a first lower transparent electrode, an organic photodiode layer, and an upper transparent electrode layer sequentially stacked, and the second organic photodiode includes a second lower transparent electrode, the organic photodiode layer, and the upper transparent electrode layer sequentially stacked,
   the organic photodiode layer and the upper transparent electrode layer are common to the first and second organic photodiodes, and
   the first and second lower transparent electrodes are spaced apart from each other on a same plane.

20. The image sensor as claimed in claim 18, further comprising a color filter between the surface of the substrate and the first and second organic photodiodes in the vertical direction.

* * * * *